United States Patent
Morrish et al.

(10) Patent No.: US 9,853,119 B2
(45) Date of Patent: Dec. 26, 2017

(54) INTEGRATION OF AN AUXILIARY DEVICE WITH A CLAMPING DEVICE IN A TRANSIENT VOLTAGE SUPPRESSOR

(71) Applicant: Bourns, Inc., Riverside, CA (US)

(72) Inventors: Andrew J. Morrish, Saratoga, CA (US); Tao Wei, Los Gatos, CA (US)

(73) Assignee: Bourns, Inc., Riverside, CA (US)

( * ) Notice: Subject to any disclaimer, the term of this patent is extended or adjusted under 35 U.S.C. 154(b) by 0 days.

(21) Appl. No.: 15/365,208

(22) Filed: Nov. 30, 2016

(65) Prior Publication Data

US 2017/0084716 A1    Mar. 23, 2017

Related U.S. Application Data

(63) Continuation-in-part of application No. 14/611,831, filed on Feb. 2, 2015, now abandoned.

(60) Provisional application No. 61/934,101, filed on Jan. 31, 2014.

(51) Int. Cl.
| | |
|---|---|
| *H01L 21/70* | (2006.01) |
| *H01L 29/66* | (2006.01) |
| *H01L 27/02* | (2006.01) |
| *H01L 27/08* | (2006.01) |

(52) U.S. Cl.
CPC .... *H01L 29/66136* (2013.01); *H01L 27/0248* (2013.01); *H01L 27/0255* (2013.01); *H01L 27/0814* (2013.01)

(58) Field of Classification Search
CPC ............. H01L 29/66136; H01L 21/041; H01L 21/02255
USPC .......................................... 438/358, 415, 357
See application file for complete search history.

(56) References Cited

U.S. PATENT DOCUMENTS

| | | | | |
|---|---|---|---|---|
| 2006/0216913 | A1* | 9/2006 | Kung | H01L 29/0661 438/478 |
| 2008/0290462 | A1* | 11/2008 | Schmenn | H01L 27/0255 257/546 |
| 2011/0309476 | A1* | 12/2011 | Mita | H01L 27/0255 257/546 |
| 2013/0072004 | A1* | 3/2013 | Tsuchiko | H01L 21/8222 438/492 |
| 2013/0126967 | A1* | 5/2013 | Toyoda | H01L 21/82348 257/334 |

* cited by examiner

*Primary Examiner* — Lex Malsawma
*Assistant Examiner* — Laura Dykes
(74) *Attorney, Agent, or Firm* — Lumen Patent Firm

(57) ABSTRACT

Monolithic integration of low-capacitance p-n junctions and low-resistance p-n junctions (when conducting in reverse bias) is provided. Three epitaxial layers are used. The low-capacitance junctions are formed by the top two epitaxial layers. The low-resistance p-n junction is formed in the top epitaxial layer, and two buried structures at interfaces between the three epitaxial layers are used to provide a high doping region that extends from the low-resistance p-n junction to the substrate, thereby providing low resistance to current flow. The epitaxial layers are lightly doped as required by the low-capacitance junction design, so the buried structures are needed for the low-resistance p-n junction. The high doping region is formed by diffusion of dopants from the substrate and from the buried structures during thermal processing.

8 Claims, 10 Drawing Sheets

INTEGRATION OF AN AUXILIARY DEVICE WITH A CLAMPING DEVICE IN A TRANSIENT VOLTAGE SUPPRESSOR

CROSS REFERENCE TO RELATED APPLICATIONS

This application is a continuation in part of U.S. Ser. No. 14/611,831 filed Feb. 2, 2015 and hereby incorporated by reference in its entirety. Application Ser. No. 14/611,831 claims the benefit of U.S. provisional patent application 61/934,101, filed on Jan. 31, 2014, and hereby incorporated by reference in its entirety.

FIELD OF THE INVENTION

This invention relates to monolithic integration of clamping devices with other devices.

BACKGROUND

Monolithic integration can be challenging if it is desired to integrate dissimilar devices. For example, Transient Voltage Suppressor (TVS) circuits typically include a main clamping element and also one or more auxiliary elements. The clamping element needs to be designed to handle high current flow in breakdown, while the auxiliary elements need to be designed for fast response (i.e., low capacitance). As described in detail in section A below, these requirements tend to conflict in a monolithic design, such that undesirable design compromises are made in conventional monolithic integration approaches for such circuits. The resulting loss of performance is significant enough that some high performance commercial TVS circuits are often made via hybrid integration, despite its much higher cost compared to monolithic integration. Accordingly, it would be an advance in the art to provide improved monolithic integration for dissimilar devices.

SUMMARY

The basic idea of the present approach is to make use of three epitaxial layers and two buried structures (as opposed to the conventional use of two epitaxial layers and a single buried structure). The use of three epitaxial layers and two buried structures allows the epitaxial layer doping levels and thicknesses to be chosen such that two dissimilar devices can be optimized without significant compromise.

The first of these devices is an auxiliary device (e.g., a low capacitance TVS steering diode) that includes a p-n junction formed by the top two epitaxial layers. The total epitaxial layer thickness is sufficient to ensure that diffusion of dopant from the substrate does not significantly perturb the auxiliary device.

The second of these dissimilar devices is a TVS clamping element that includes two buried structures at interfaces between the epitaxial layers. Thermal processing resulting in diffusion from the substrate and from the buried structures such that a single continuous region of high doping is formed by diffusion that extends from the substrate up to the top epitaxial layer. This region of high doping allows the TVS clamping element to include a p-n junction fabricated in the top epitaxial layer that will have very low resistance when conducting.

An exemplary embodiment is a TVS that includes at least one TVS clamping element and at least one auxiliary device connected to the TVS clamping element. The TVS clamping element and the auxiliary device are monolithically fabricated in a structure that includes:

i) a first epitaxial layer disposed on a substrate,
 ii) a second epitaxial layer disposed on the first epitaxial layer and having a first interface therebetween and
 iii) a third epitaxial layer disposed on the second epitaxial layer and having a second interface therebetween, where the second and third epitaxial layers have opposite doping type.

The TVS clamping element further includes a first buried structure at the first interface and a second buried structure at the second interface. Thermal processing of the TVS provides a continuous region having doping concentration of $5e16$ $cm^{-3}$ or greater in the TVS clamping element that is formed by diffusion and merging of the first and second buried structures in the second epitaxial layer and by diffusion of the first buried structure to the substrate.

The auxiliary device includes a p-n junction having a depletion region formed in the second and third epitaxial layers. Note that the buried structures are not present for fabrication of the auxiliary devices. Thus, the buried structures are laterally patterned (e.g., by microlithography) to be present where TVS clamping elements are to be formed, and to be absent where the auxiliary devices are to be formed.

DETAILED DESCRIPTION

To better appreciate the present invention, it will be helpful to consider a conventional TVS design in detail (section A below), followed by a description of the new approach (section B below).

A) Conventional TVS Design Requires Compromise to Achieve Monolithic Integration A Transient Voltage Suppressor (TVS) clamping device must be able to sustain high current when surge voltage is above a required breakdown voltage (BV). The clamping device, typically a Zener diode, a punch through diode, or a Thyristor (SCR) device, physically has to be large enough in area to withstand the power requirements. The conduction resistance must be low, in order that the voltage is clamped as closely as possible to the breakdown voltage, requiring a relatively large junction area. Additionally, the typically low BV requires a relatively heavily doped junction. These factors in general result in a very large device capacitance, which makes the TVS unsuitable for connection directly across high speed signal applications.

Figure 1:
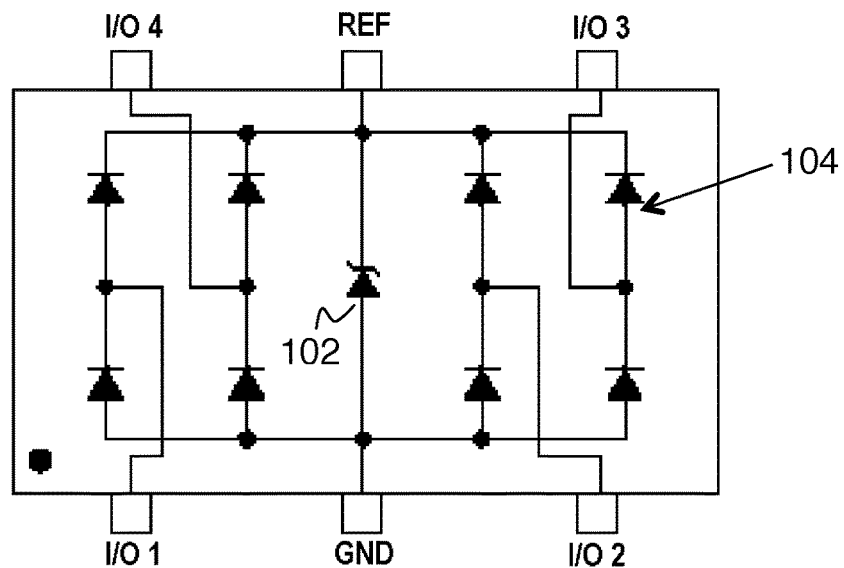
FIG. 1 shows an exemplary prior art TVS diode array circuit.

In a TVS diode array, one or more pairs of "steering diodes" are connected to a high power reverse biased Zener or avalanche TVS diode. When in circuit, a positive or negative voltage will be clamped in either direction by the top or bottom steering diodes. A typical array is shown in FIG. 1. Here 102 is the TVS clamping device, and 104 are the steering diodes.

The steering diodes are relatively small, as they only ever conduct high current in the forward direction. Being physically small compared to the TVS, they have lower capacitance, and thus cause minimal loading on the signal line. These diodes are created using high resistivity p and n type silicon to create a junction with a wide depletion layer and hence low capacitance. One diode connects to the cathode, and the other to the anode of the TVS clamping diode 102, with the signal applied to the connection of the pair of steering diodes. The steering diodes are reverse biased in normal signal operation by a biasing voltage applied to the TVS.

Such diode arrays can be build using discrete diodes assembled together in a "Multi-Chip Module" (MCM), which is advantageous in performance as the individual diodes can be designed and processed in a manner that results in optimal performance:

1) the steering diodes can be easily made with low doped junctions, so as to create a wide depletion region, and hence very low capacitance.

2) the separate TVS clamping device can be made using highly doped substrate and junctions, resulting in low forward resistance and good clamping characteristics A disadvantage of the MCM approach is that the assembly costs of multiple die in one package can be very high.

It is desirable to integrate the devices into a single (monolithic) die to drastically reduce the assembly cost. In a fully integrated TVS array, all device types are built on the same semiconductor chip. However, because all the processing has to be done on a single wafer, designs using conventional prior art have not been able to achieve the same level of low capacitance and low forward voltages as achieved by MCM designs.

Figure 2:
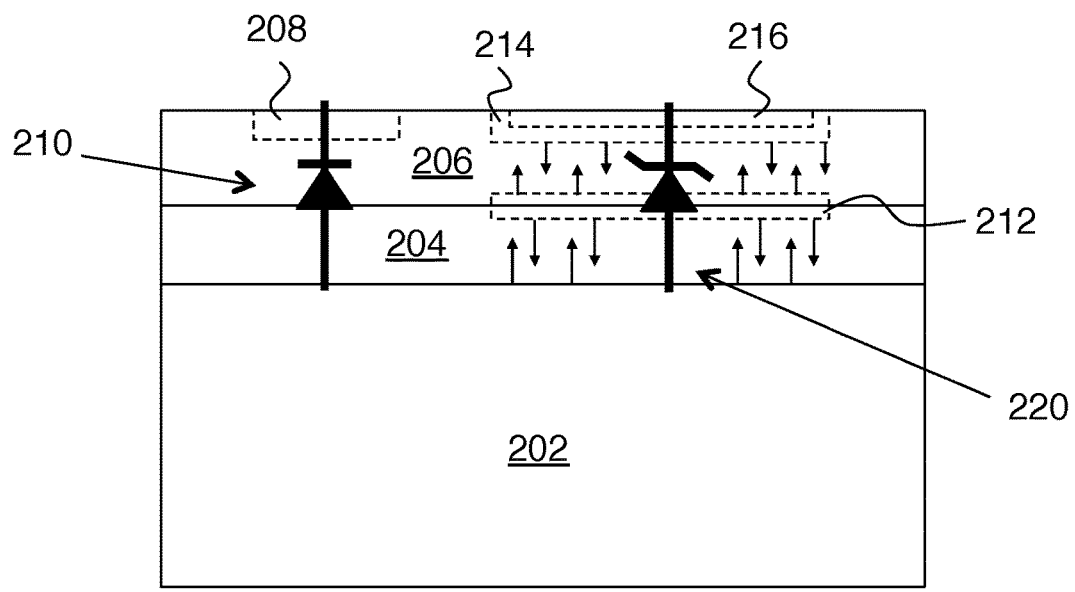
FIG. 2 shows a conventional approach for TVS diode array integration.

In a conventional monolithic TVS array structure, two relevant device types are shown on FIG. 2 (excluding top metal connections and passivation layers etc.). A vertical diode structure 210 is used for the bottom, negative clamping, steering diode. A lateral diode (not shown) can be used for the top, positive clamping, steering diode. A large vertical diode 220 is used as the main TVS clamping element.

A highly doped P+ type substrate 202 is used. Very high doping is required to reduce the resistivity of the substrate to a low level, to minimize conduction resistance of both the TVS 220 and the vertical steering diode 210. Two layers of Epi are grown, the first epi layer 204 being a low doped P– Epi, the second epi payer 206 being an N– doped Epi. Note that in practice, due to the thermal processing, P dopant from the heavily doped substrate diffuses up through the bottom P– Epi 204. This diffusion can extend beyond the P–/N– Epi interface, effectively moving the junction formed by the two Epi layers up further into the N– Epi layer.

The conventional construction of these two vertical diodes is as follows.

1) The TVS device is made by implanting a highly doped P+ buried layer 212 at the interface between the P– and N– epi. A P+ implant 214 is diffused from the top followed by an N+ implant 216 to form the N+/P+ TVS junction. The buried layer 212 diffuses under thermal drive to connect the top P+ implant 214 to the substrate 202, as shown by the arrows on FIG. 2. Buried layer 212 is important, as otherwise this connection cannot be satisfactorily made, and the effective conduction resistance of the TVS would be unacceptably high.

Figure 3:
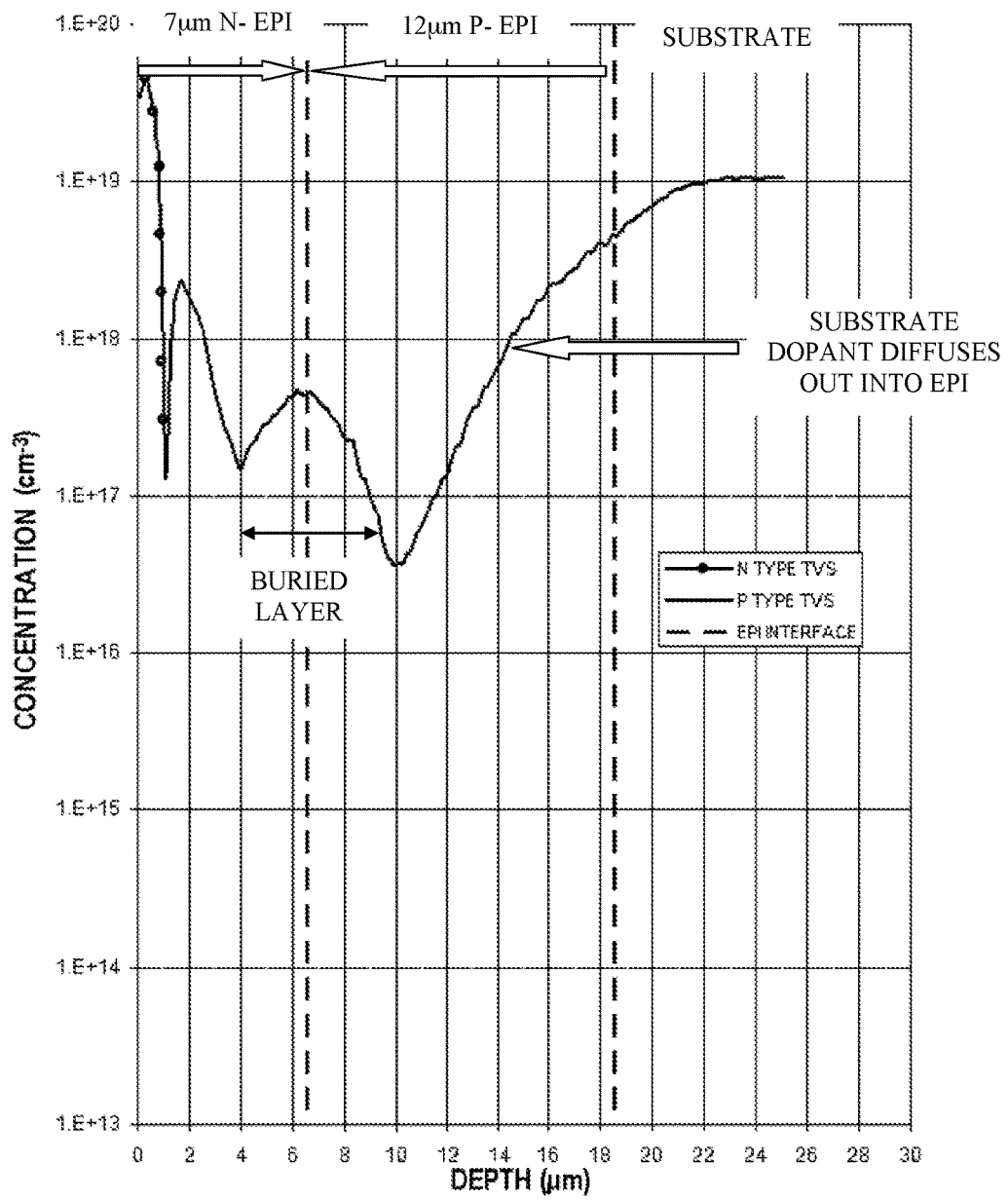
FIG. 3 shows the doping profile at the TVS clamping element for the approach of FIG. 2.

FIG. 3 shows a Spreading Resistance Profile (SRP) measurement through a TVS, showing doping concentration as affected by diffusion of the buried layer. It can be seen that the minimum P doping concentration remains significantly higher than 1e16 $cm^3$, giving low TVS resistance. The minimum concentration occurs about 10 μm from the surface where the diffusion from the buried layer 212 meets the diffusion coming up from the substrate 202. It can be seen that the thickness of the Epi layers cannot be made too thick, or else the concentration level in these "valleys" will drop and the effective series resistance will increase significantly. Thus it can be seen that narrow P– Epi and N– Epi layers (i.e., layers 204 and 206) are desirable to reduce this TVS resistance to a minimum.

2) The vertical steering diode utilizes the junction formed by the top N epi layer 206 and the bottom P epi layer 204. An N+ contact region 208 is implanted at the top to provide a low resistance connection to the top metal layer. Ideally, for lowest capacitance, the junction of this diode should be formed by the interface of the N– and P– Epi. For example, using Epi doping concentrations that can give resistivity levels normally reached in a typical fab of 5e13 $cm^{-3}$ N– and 1.5e14 $cm^{-3}$ P– Epi (approx. 80 ohm.cm), we would expect to form an abrupt junction with a depletion region of approximately 4 μm total width, with a capacitance per unit area of approx. 2.5 $nF/cm^2$. However, the P dopant diffusing up from the substrate 202, beyond the first and second Epi interface, converts the lower region of the N– Epi layer 204 into heavier doped P type, and effectively moves the junction closer to the surface, where the substrate P dopant then intersects with the highly doped N+ contact dopant diffusion from contact 208.

Figure 4:
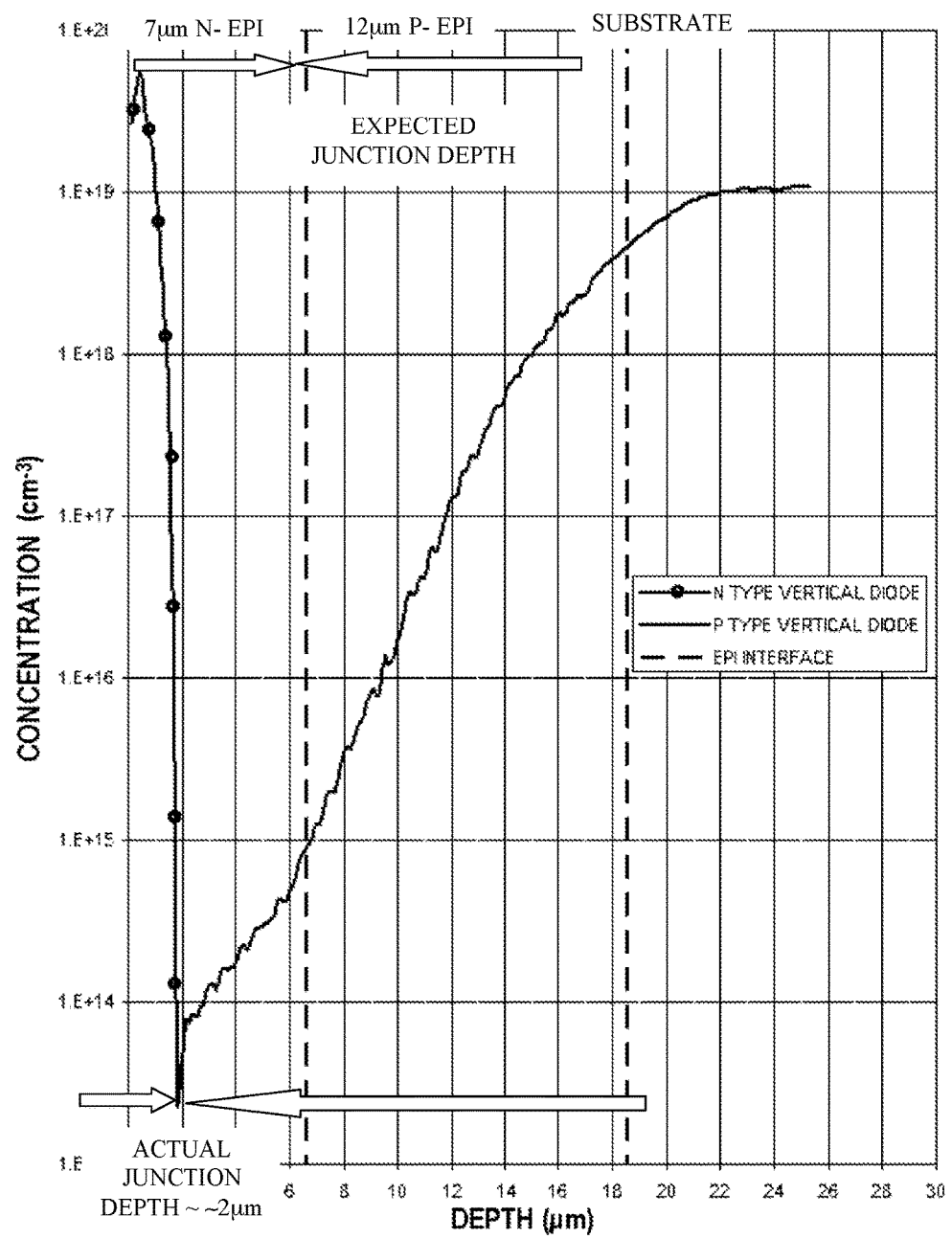
FIG. 4 shows the doping profile at the auxiliary element for the approach of FIG. 2.

FIG. 4 shows an SRP measurement of the doping concentration of a typical integrated vertical steering diode. Here, the first P– Epi layer 204 has a thickness of 12 μm and the second N– Epi layer 206 has 7 μm thickness. It can be seen that the substrate P dopant diffuses about 5 μm into the N– Epi 206. The concentration of the P type at the junction interface is around 1e14 $cm^{-3}$, but rises rapidly away from the junction. The N type doping is very high, rising to 1e15 $cm^{-3}$ less than 0.1 μm from the junction. This results in a mostly one sided depletion region width of approx. 2 μm and a capacitance of over 5 $nF/cm^2$, double the ideal value.

It can readily be seen that wider P– Epi and N– Epi layers are desirable to allow the doping concentration from the substrate diffusion to subside completely to the intended Epi doping levels, and hence give the lowest doping levels at the diode junction, and therefore a wider depletion region. This in turn gives a lower capacitance junction. As the P dopant from the substrate has defused approximately 17 μm away from the substrate-Epi interface, and we desire sufficient low doping concentration depth extending at least around 2.5 μm either side of the junction to accommodate the depletion region, it implies we need a total P– Epi thickness of approx. 20 μm to ensure this objective can be met.

Figure 5:
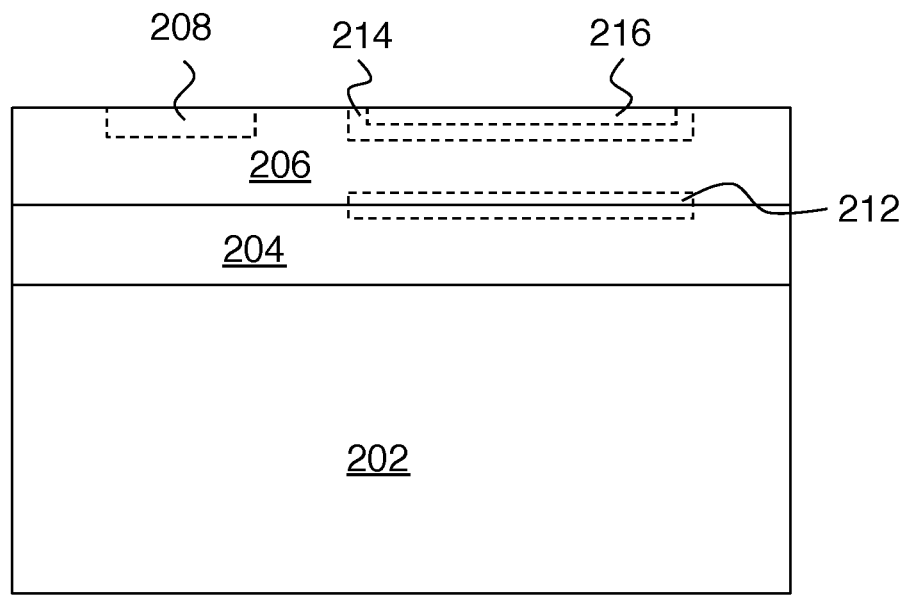
FIG. 5 shows an epitaxial layer and buried structure configuration that will lead to structure of FIG. 2 after thermal processing.

FIG. 5 shows the nominal positions of typical implants, and the initial state of the Epi doping before diffusion caused by thermal processing, which yields the profile previously illustrated in FIG. 2. It can be readily seen that the conventional design requires careful optimization to provide the optimum performance. While a narrow Epi (204 and 206) is best for the main TVS clamping diode, wide Epi layers (204 and 206) are better for the vertical steering diode construction. The prior art design described above therefore requires a compromise of Epi thicknesses to give the overall best forward TVS resistance and steering diode performance. While a compromise value can be reached, the result is an integrated diode with inferior capacitance compared to the discrete diode, and thus, in today's market, low capacitance, high current TVS diode arrays are most often constructed using MCM techniques with separate TVS and steering diode dies, each independently optimized for performance.

B) An Improved Integrated TVS Diode Design

Figure 6A:
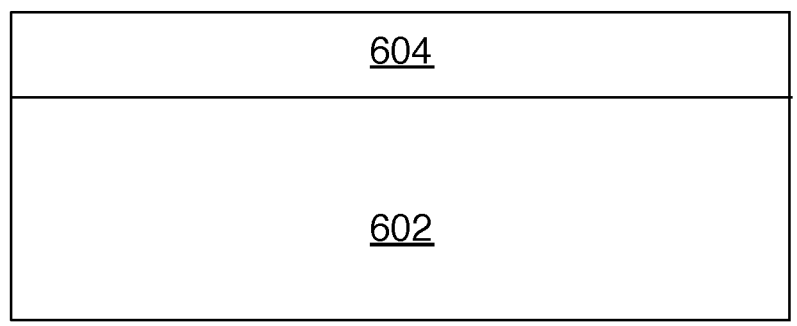
FIGS. 6A-H show an exemplary fabrication sequence for an embodiment of the invention.

In order to overcome the above-described limitations of the existing design, we provide the following approach for building low capacitance TVS arrays:

Step 1) As shown on FIG. 6A, grow a first Epi layer 604 to a thickness whereby the diffusion from the substrate 602 during subsequent thermal processing will ensure doping to P type throughout this layer. This Epi type is typically near intrinsic as grown (i.e., the doping level is preferably 5e14 $cm^{-3}$ or less). As the subsequent doping from the substrate diffusion is far higher in concentration than the deposited doping of this layer, the dopant level and species is not critical. The thickness of this layer is preferably between about 5 µm and about 15 µm (typically approx. 11 µm) and is chosen so that it allows the concentration due to substrate diffusion to drop significantly at the top of this Epi layer (e.g. typically to approx. 1e15 $cm^{-3}$) after the thermal processing has been completed, and so that the subsequent P type buried layer in Step 2 can diffuse down and form a continuous highly doped region all the way to the substrate 602.

Figure 6B:
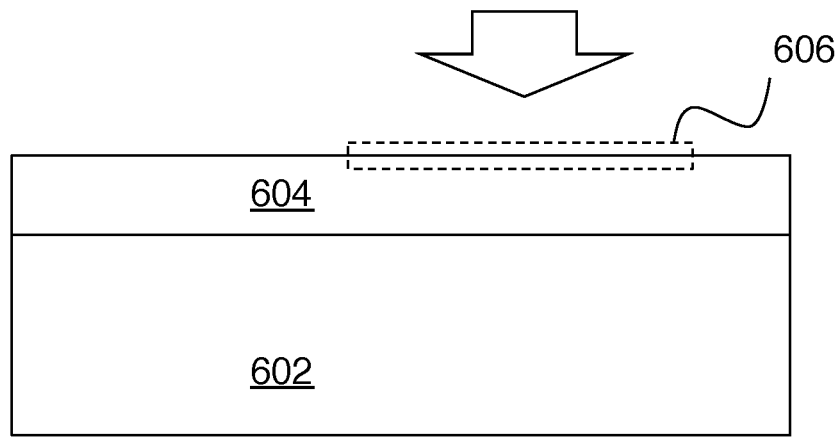

Step 2) As shown on FIG. 6B, implant or diffuse in a heavy dose of P type material to form a buried layer 606 underneath the TVS clamping diode area. This will be subsequently thermally driven to diffuse both upwards and downwards to form a low resistance, high P concentration region under the TVS clamping diode.

Figure 6C:
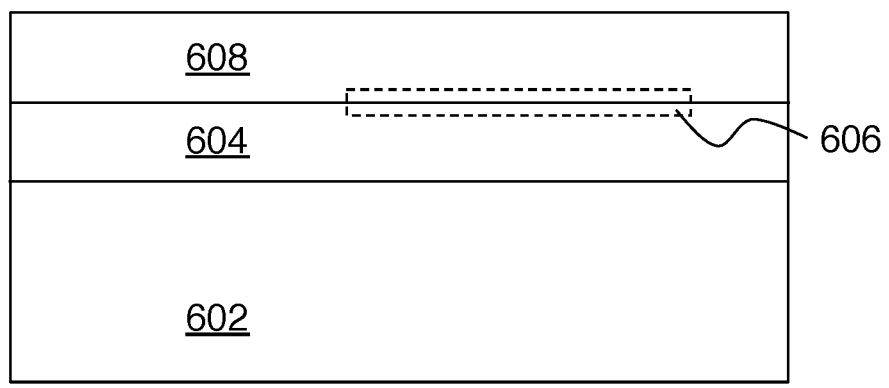

Step 3) As shown on FIG. 6C, grow a second Epi layer 608 of low P− doping concentration that will form part of the P− side of the vertical steering diode. The doping level is normally as low as can be reliably controlled by the Epi growth process, for example 100 ohm.cm (i.e., the doping level is preferably 5e14 $cm^{-3}$ or less, and is more preferably approx. 1.3e14 $cm^{-3}$). The Epi thickness should be such the that diffusion of P dopant from the substrate drops below the second Epi layer P concentration level within a defined and controlled distance from the top surface of the second layer after the thermal processing has been completed, typically requiring a second Epi layer thickness preferably between about 5 µm and about 15 µm (e.g., approx. 7 µm).

Figure 6D:
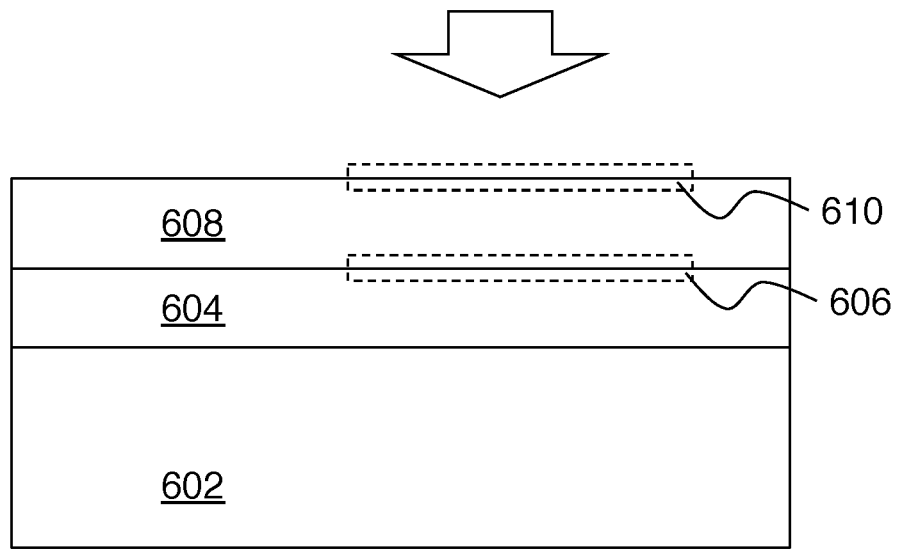

Step 4) As shown on FIG. 6D, implant or diffuse in a second heavy dose of P type material to form a second buried layer 610 underneath the TVS clamping diode area. Again, this will be subsequently thermally driven to diffuse both upwards and downwards to form a low resistance, high P concentration region under the TVS diode, connecting to the first buried layer below, and to the top P implant that forms the TVS diode.

Figure 6E:
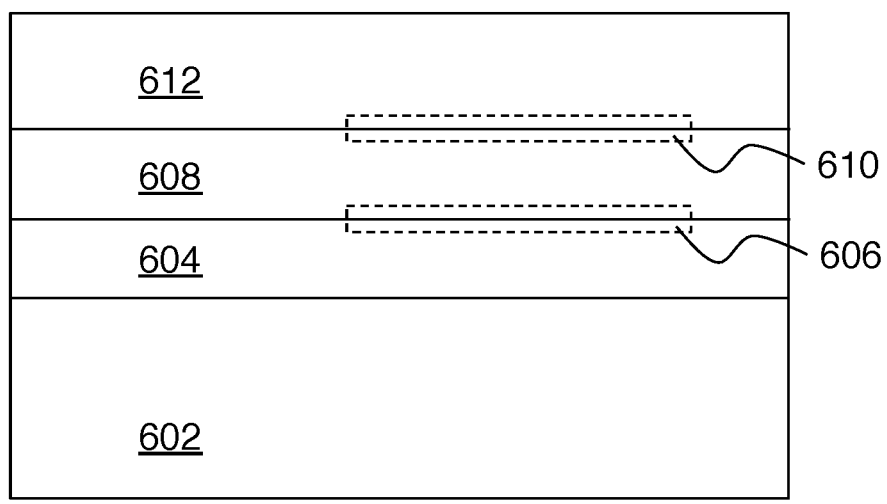

Step 5) As shown on FIG. 6E, grow a third Epi layer 612 of N− doping concentration that is required to form the N− side of the vertical steering diode, normally of as high resistivity as can be reliably controlled by the Epi growth process, (i.e., the doping level is preferably 5e14 $cm^{-3}$ or less). For example, a resistivity of approx. 100 ohm.cm, corresponds to a concentration of approximately 5e13 $cm^{-3}$. The thickness of the third Epi layer will be such that the region of N− at the N−/P− interface after a N+ top contact is implanted, will be sufficient to allow for the full depletion width expected under reverse voltage bias for the vertical diode to provide the required lowest capacitance. Assuming the Epi concentration of 5e13 $cm^{-3}$, we must allow approx. 3 µm for the depletion region, and approx. 2 µm for the top N+ contact. In addition, a region of near intrinsic concentration would result from the compensation caused by the diffusion between the N− and P− Epi, so we must also allow 1-2 µm for this, and hence between about 3 µm and about 10 µtm (e.g., approx. 6 µm) would be a preferred thickness for the N− Epi 612. This top layer Epi thickness may be further increased due to normal considerations of the design of the lateral diode, or of any other devices to be integrated with the TVS diode array.

Figure 6F:
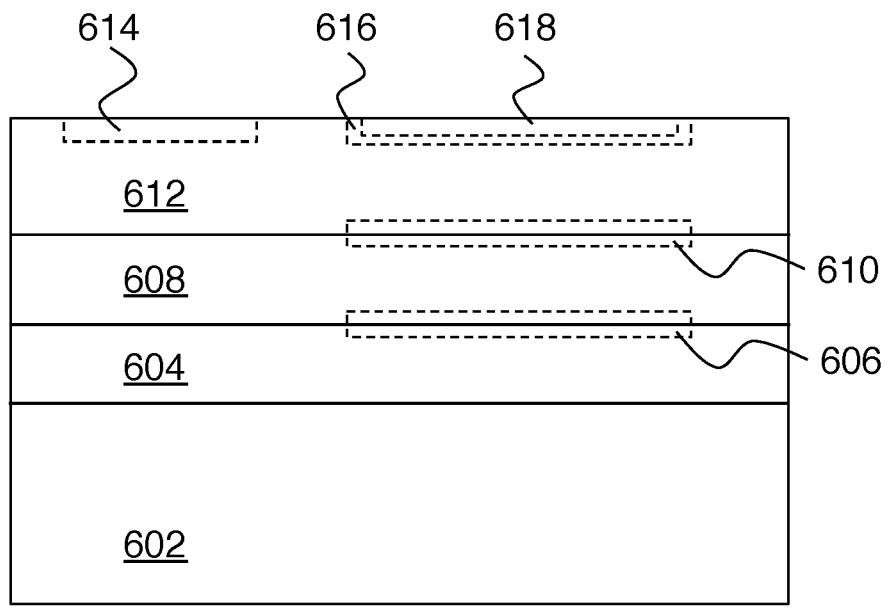

Step 6) As shown on FIG. 6F, P+ and N+ implants (616 and 618 respectively) are made to complete the TVS clamping diode, an N+ contact 614 is made for the top connection to the vertical steering diode, and other implants and processing are made for any other device structures, such as lateral diodes. Metallization and passivation are carried out as per usual processing.

Figure 6G:
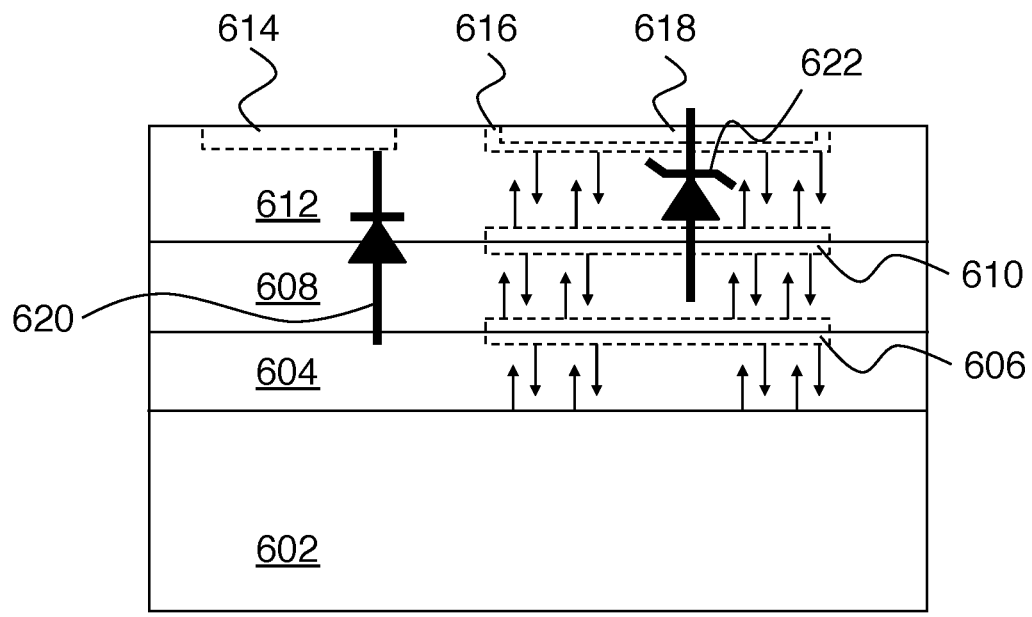
Figure 6H:
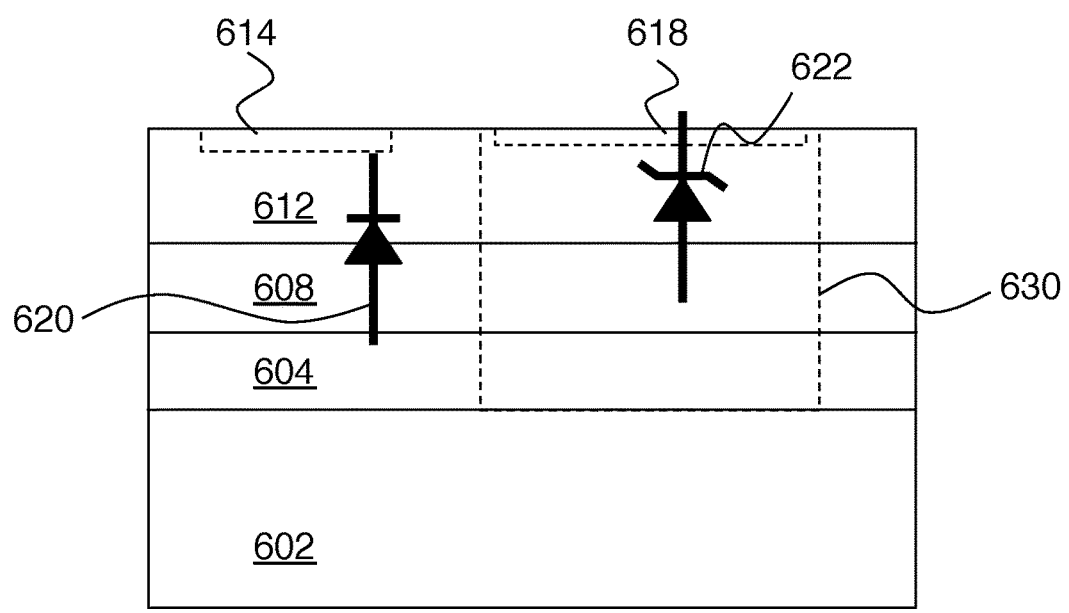

Thermal processing during the fabrication process will result in the diffusion of the dopants, and the resulting profile will resemble that shown on FIG. 6G-H. Here the vertical steering diode is referenced as 620 and the TVS clamping diode is referenced as 622. Note that the vertical steering diode junction is now formed by the junction of the low doped Epi layers 608 and 612. The two buried layers 606 and 610 beneath the TVS allow a low resistance path 630 to the substrate for low forward voltage drop. Even with the additional buried layer, it is possible that a small increase in the effective series resistance may be found due to the additional buried layer. This may be compensated by proportionally increasing the area of the TVS.

Figure 7:
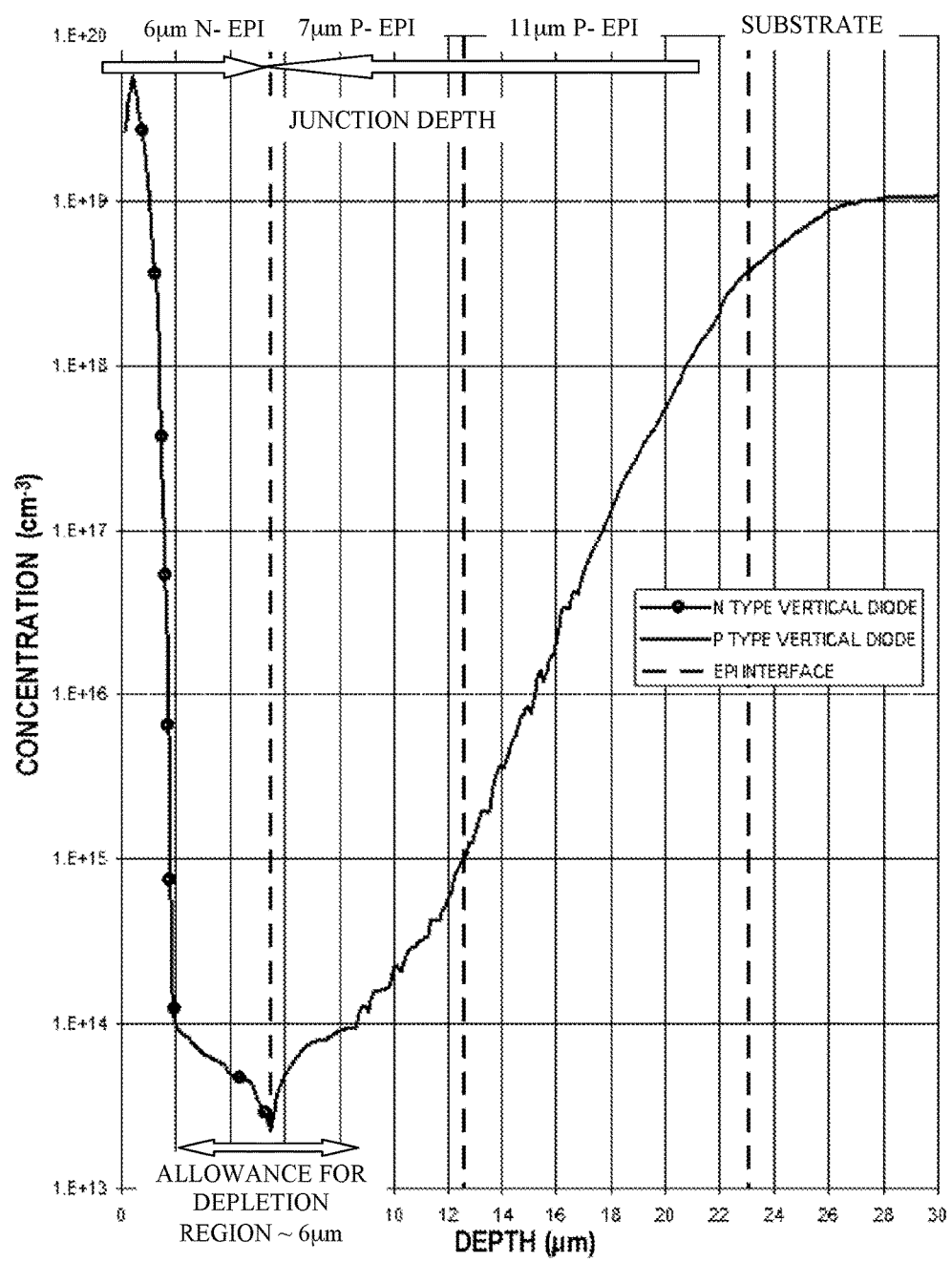
FIG. 7 shows the doping profile at the auxiliary element for the embodiment of FIG. 6H.
Figure 8:
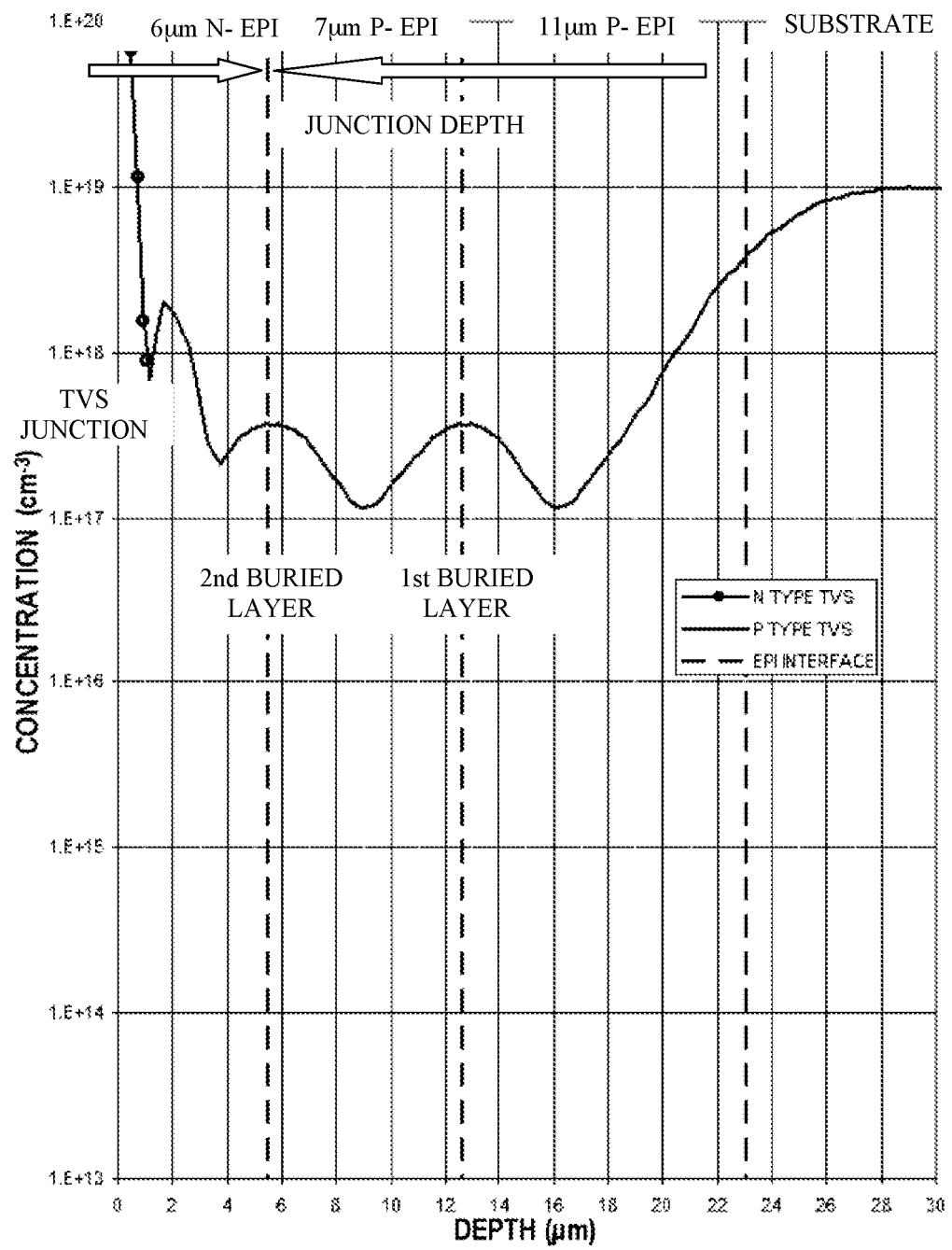
FIG. 8 shows the doping profile at the TVS clamping element for the embodiment of FIG. 6H.

The final structure results in an SRP for the vertical diode that provides the desired low concentration regions on either side of the N−/P− Epi interface, as shown on FIG. 7. The TVS clamping element SRP shows that the resistivity below the TVS remains low, giving low clamping resistance, as shown on FIG. 8.

In conclusion, a unique device design is provided that eliminates the need to compromise between TVS resistance and steering diode capacitance by utilizing a third Epi layer. The design can be characterized by 1) A requirement to provide a continuous low resistance path to the substrate below the TVS by virtue of multiple buried layers, which can be accommodated by a third Epi allowing a second interface at which an additional buried layer is provided.

2) Sufficient thickness of first and second Epi layers to allow for diffusion of P dopant up from the substrate to drop to a level less than the Epi level dopant concentration, with an additional region of P− Epi in the second layer wide enough to accommodate the depletion region of the vertical steering diode on the P− side.

3) A third N− Epi of sufficient thickness to allow for diffusion of N dopant down from the vertical diode N+ contact implant to drop to a level less than the top Epi level dopant concentration, with an additional region of N− Epi in the top layer wide enough to accommodate the depletion region of the vertical steering diode on the N− side.

Illustrations of Epi depth computation have been given by way of example to show how this design may be optimized for specific Epi dopant concentrations. Specific thickness may be adjusted dependent upon variations in Epi doping levels due to design consideration, and the amount of thermal processing which will consequently alter the amount of diffusion up from the substrate using the same considerations as outlined in this design process.

Other variations of the given examples can also be considered, e.g., exchanging p-type and n-type doping.

The invention claimed is:

1. A method of making a transient voltage suppressor (TVS), the method comprising:
   a) providing at least one TVS clamping element; and
   b) providing at least one auxiliary device connected to the TVS clamping element;
   wherein the TVS clamping element and the auxiliary device are monolithically fabricated in a structure comprising:
   i) a first epitaxial layer disposed on a substrate,
   ii) a second epitaxial layer disposed on the first epitaxial layer and having a first interface therebetween and
   iii) a third epitaxial layer disposed on the second epitaxial layer and having a second interface therebetween, wherein the second and third epitaxial layers have opposite doping type,
   wherein the TVS clamping element further comprises a first buried structure at the first interface and a second buried structure at the second interface, and wherein thermal processing of the TVS provides a continuous region having doping concentration of 5e16 $cm^{-3}$ or greater in the TVS clamping element that is formed by diffusion and merging of the first and second buried structures in the second epitaxial layer and by diffusion of the first buried structure to the substrate;
   wherein the auxiliary device includes a p-n junction having a depletion region formed in the second and third epitaxial layers;
   wherein the continuous region extends from a p-n junction of the TVS clamping element to the substrate.

2. The method of claim 1, wherein the auxiliary device is a steering diode.

3. The method of claim 1, wherein a doping of the first epitaxial layer is 5e14 $cm^{-3}$ or less.

4. The method of claim 1, wherein a doping of the second epitaxial layer is 5e14 $cm^{-3}$ or less.

5. The method of claim 1, wherein a doping of the third epitaxial layer is 5e14 $cm^{-3}$ or less.

6. The method of claim 1, wherein a thickness of the first epitaxial layer is between about 5 μm and about 15 μm.

7. The method of claim 1, wherein a thickness of the second epitaxial layer is between about 5 μm and about 15 μm.

8. The method of claim 1, wherein a thickness of the third epitaxial layer is between about 3 μm and about 10 μm.

* * * * *